(12) United States Patent
Kuo et al.

(10) Patent No.: US 10,903,269 B2
(45) Date of Patent: Jan. 26, 2021

(54) MAGNETIC MEMORY DEVICE AND FABRICATION METHOD THEREOF

(71) Applicant: UNITED MICROELECTRONICS CORP., Hsin-Chu (TW)

(72) Inventors: Chih-Wei Kuo, Tainan (TW);
Yu-Tsung Lai, Tainan (TW);
Jiunn-Hsiung Liao, Tainan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 16/504,345

(22) Filed: Jul. 8, 2019

(65) Prior Publication Data
US 2020/0388648 A1 Dec. 10, 2020

(30) Foreign Application Priority Data

Jun. 5, 2019 (CN) .......................... 2019 1 0484876

(51) Int. Cl.
*H01L 27/22* (2006.01)
*H01L 43/02* (2006.01)
*H01L 21/768* (2006.01)
*H01L 43/12* (2006.01)

(52) U.S. Cl.
CPC ...... *H01L 27/228* (2013.01); *H01L 21/76802* (2013.01); *H01L 21/76832* (2013.01); *H01L 43/02* (2013.01); *H01L 43/12* (2013.01)

(58) Field of Classification Search
CPC ............ H01L 27/228; H01L 21/76802; H01L 21/76832; H01L 43/02; H01L 43/12
See application file for complete search history.

(56) References Cited

U.S. PATENT DOCUMENTS

| 9,041,146 | B2 | 5/2015 | Lee | |
|---|---|---|---|---|
| 10,580,968 | B1* | 3/2020 | Yi | .......................... G11C 11/161 |
| 2009/0140386 | A1* | 6/2009 | Inoue | ...................... H01L 28/40 |
| | | | | 257/532 |
| 2013/0256778 | A1* | 10/2013 | Sim | ................... H01L 27/11529 |
| | | | | 257/316 |
| 2015/0032960 | A1* | 1/2015 | Dong | ................... G06F 12/0842 |
| | | | | 711/118 |
| 2019/0165258 | A1* | 5/2019 | Peng | ...................... H01L 43/08 |

* cited by examiner

*Primary Examiner* — Fernando L Toledo
*Assistant Examiner* — Neil R Prasad
(74) *Attorney, Agent, or Firm* — Winston Hsu

(57) ABSTRACT

A magnetic memory device includes a first dielectric layer on a substrate, first and second via plugs in the first dielectric layer, first and second cylindrical memory stacks on the first and second via plugs, respectively, and an insulating cap layer conformally disposed on the first dielectric layer and on sidewalls of the first and second cylindrical memory stacks. The insulating cap layer is not disposed in a logic area and a via forming region between the first and second cylindrical memory stacks.

20 Claims, 7 Drawing Sheets

MAGNETIC MEMORY DEVICE AND FABRICATION METHOD THEREOF

BACKGROUND OF THE INVENTION

1. Field of the Invention

The present invention relates to the field of semiconductor device technology, and more particularly to a spin-transfer torque magnetoresistive random access memory (STT-MRAM) structure and a method of fabricating the same.

2. Description of the Prior Art

As known in the art, spin-transfer torque magnetoresistive random access memory (STT-MRAM) is a non-volatile memory that has come under much scrutiny recently in the industry, which has several advantages over the conventional magnetoresistive random access memory. For example, these advantages include higher endurance, lower-power consumption, and faster operating speed.

In a magnetic tunnel junction (MTJ) including two ferromagnetic layers having a thin insulating layer therebetween, the tunnel resistance varies depending on the relative directions of magnetization of the two ferromagnetic layers. A magnetoresistive random access memory may be a semiconductor device where magnetic elements (MTJ elements) having MTJs utilizing a tunnel magneto resistance (TMR) effect are arranged in a matrix form as a memory cell.

SUMMARY OF THE INVENTION

The present invention provides an improved spin-transfer-torque magnetoresistive random access memory (STT-MRAM) structure and a method of fabricating the same.

One aspect of the invention discloses a magnetic memory device including a substrate having a memory area and a logic area thereon; a first dielectric layer disposed on the substrate, wherein the first dielectric layer covers the memory area and the logic area; a first via plug disposed in the first dielectric layer; a first cylindrical memory stack disposed on the first via plug, wherein the first cylindrical memory stack comprises a first magnetic tunnel junction (MTJ) element; a second via plug disposed in the first dielectric layer and in proximity to the first via plug; a second cylindrical memory stack disposed on the second via plug, wherein the second cylindrical memory stack comprises a second magnetic tunnel junction (MTJ) element; an insulating cap layer conformally disposed on the first dielectric layer and on sidewalls of the first cylindrical memory stack and the second cylindrical memory stack. The insulating cap layer is not disposed in the logic area and a via forming region between the first cylindrical memory stack and the second cylindrical memory stack.

According to some embodiments, the first dielectric layer has a first minimum thickness in the memory area, a second minimum thickness in the via forming region between the first cylindrical memory stack and the second cylindrical memory stack, and a third minimum thickness in the logic area, wherein the second minimum thickness is approximately equal to the third minimum thickness, and wherein the second minimum thickness and the third minimum thickness are smaller than the first minimum thickness.

According to some embodiments, the magnetic memory device further includes: a second dielectric layer disposed on the substrate and under the first dielectric layer; and an etch stop layer between the first dielectric layer and the second dielectric layer.

According to some embodiments, the magnetic memory device further includes: a first spacer disposed on the insulating cap layer and disposed around the first cylindrical memory stack except for the via forming region; and a second spacer disposed on the insulating cap layer and disposed around the second cylindrical memory stack except for the via forming region.

According to some embodiments, the etch stop layer is a nitrogen-doped silicon carbide layer, the first dielectric layer and the second dielectric layer comprise an ultra-low k material, the insulating cap layer is a silicon nitride layer, and the first spacer and the second spacer are silicon oxide spacers.

According to some embodiments, the magnetic memory device further includes: a third dielectric layer filled into the via forming region between the first cylindrical memory stack and the second cylindrical memory stack, and wherein the third dielectric layer also covers the logic area, and wherein the third dielectric layer is in direct contact with the first dielectric layer in the logic area and the first dielectric layer in via forming region.

According to some embodiments, the magnetic memory device further includes: a lower metal interconnect layer disposed in the second dielectric layer, wherein the lower metal interconnect layer comprises a first metal pad in direct contact with the first via plug, a second metal pad in direct contact with the second via plug, and a first metal line disposed between the first metal pad and the second metal pad.

According to some embodiments, the magnetic memory device further includes: a first conductive via disposed in the third dielectric layer, the first dielectric layer and the etch stop layer, wherein the first conductive via is in direct contact with the first metal line.

According to some embodiments, the magnetic memory device further includes: a second metal line disposed in the second dielectric layer within the logic area, and a second conductive via disposed in the third dielectric layer, the first dielectric layer and the etch stop layer, wherein the second conductive via is in direct contact with the second metal line.

According to some embodiments, the first via plug and the second via plug are tungsten plugs, and wherein the first conductive via and the second conductive via are copper vias.

According to some embodiments, the first conductive via and the second conductive via have a top surface that is coplanar with a top surface of the third dielectric layer and a top surface of the first cylindrical memory stack and the second cylindrical memory stack.

Another aspect of the present disclosure provides a method for forming a memory device. A substrate having a memory area and a logic area thereon is provided. A first dielectric layer is formed on the substrate. The first dielectric layer covers the memory area and the logic area. A first via plug and a second via plug are formed in the first dielectric layer in the memory area. A first cylindrical memory stack and a second cylindrical memory stack are formed on the first via plug and the second via plug, respectively. An insulating cap layer is conformally deposited on the first cylindrical memory stack, the second cylindrical memory stack, and the first dielectric layer. An etch mask is formed to cover the memory area but exposes the logic area. The etch mask also exposes a via forming region between the first cylindrical memory stack and the second cylindrical memory stack. The insulating cap layer and a portion of the first dielectric layer are etched away from the via forming region, and the insulating cap layer and a portion of the first dielectric layer are etched away from the logic area.

According to some embodiments, the method further includes: depositing a spacer layer on the insulating cap layer; and anisotropically etching the spacer layer, thereby forming a first spacer on the insulating cap layer and around the first cylindrical memory stack and a second spacer on the insulating cap layer and around the second cylindrical memory stack.

According to some embodiments, the method further includes: etching away a portion of the first spacer and a portion of the second spacer from the via forming region.

According to some embodiments, the etch mask is a patterned photoresist layer.

According to some embodiments, the method further incudes: removing the etch mask.

According to some embodiments, the method further includes: forming a second dielectric disposed on the substrate and under the first dielectric layer; and forming an etch stop layer between the first dielectric layer and the second dielectric layer.

According to some embodiments, the etch stop layer is a nitrogen-doped silicon carbide layer, the first dielectric layer and the second dielectric layer comprise an ultra-low k material, the insulating cap layer is a silicon nitride layer, and the spacer layer is a silicon oxide layer.

According to some embodiments, the method further includes: forming a third dielectric layer into the via forming region between the first cylindrical memory stack and the second cylindrical memory stack, wherein the third dielectric layer also covers the logic area, and wherein the third dielectric layer is in direct contact with the first dielectric layer in the logic area and is in direct contact with the first dielectric layer in via forming region.

According to some embodiments, the method further includes: forming a lower metal interconnect layer in the second dielectric layer, wherein the lower metal interconnect layer comprises a first metal pad in direct contact with the first via plug, a second metal pad in direct contact with the second via plug, and a first metal line disposed between the first metal pad and the second metal pad.

According to some embodiments, the method further includes: forming a first conductive via in the third dielectric layer, the first dielectric layer and the etch stop layer, wherein the first conductive via is in direct contact with the first metal line.

According to some embodiments, the method further includes: forming a second metal line in the second dielectric layer within the logic area; and forming a second conductive via in the third dielectric layer, the first dielectric layer and the etch stop layer, wherein the second conductive via is in direct contact with the second metal line.

According to some embodiments, the first conductive via and the second conductive via have a top surface that is coplanar with a top surface of the third dielectric layer and a top surface of the first cylindrical memory stack and the second cylindrical memory stack.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Embodiments of the present invention disclose a magnetic memory device, such as a magnetoresistive random access memory (MRAM), characterized in that a first metal line is further disposed between a first metal pad and a second metal pad in a metal layer (M2) located in a memory array region (hereinafter referred to as a memory region), which can be electrically connected to a drain terminal of an access transistor in a logic circuit region (hereinafter referred to as a logic region). A via (for example, a copper dual damascene via composed of a metal layer M3 and a via V2) may be disposed directly on the first metal line. The top electrode of the cylindrical memory stack of the magnetoresistive random access memory is electrically connected to the via on the first metal line through an upper metal interconnect layer (for example, the copper dual damascene interconnect formed by the metal layer M4 and the via V3) such that the top electrode of the cylindrical memory stack of the magnetoresistive random access memory can be electrically connected to the drain terminal of the access transistor in the logic region.

The above-described configuration is also known as the reverse cell configuration, which has the advantages of having a larger write margin and improved chemical mechanical polishing (CMP) loading effect.

Figure 1:
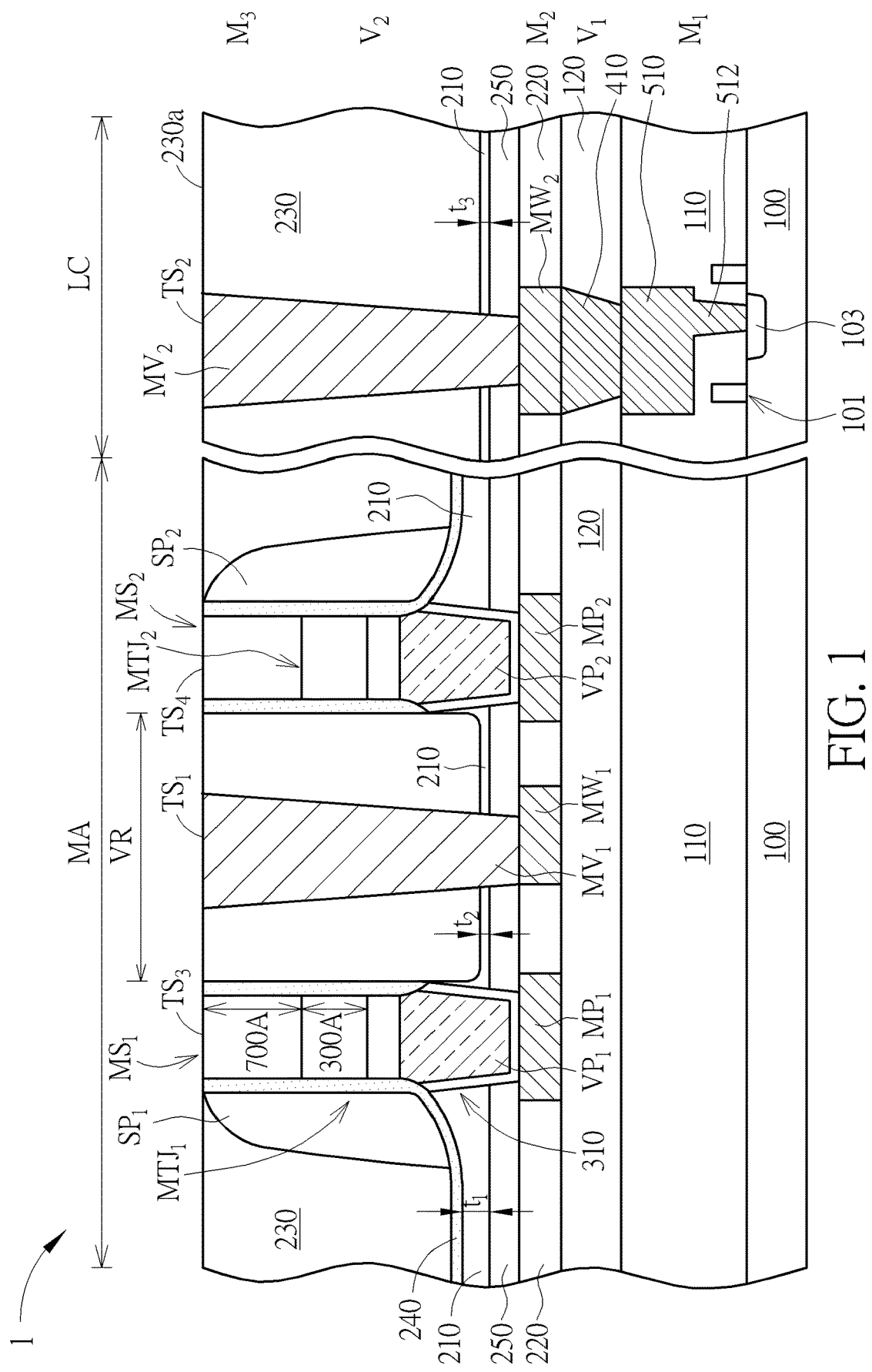
FIG. 1 is a partial cross-sectional view of a magnetic memory device according to an embodiment of the invention.

Please refer to FIG. 1, which is a partial cross-sectional view of a magnetic memory device according to an embodiment of the invention. According to an embodiment of the present invention, as shown in FIG. 1, the magnetic memory device 1 comprises a substrate 100, a first dielectric layer 210 disposed on the substrate 100, a first via plug $VP_1$ disposed in the first dielectric layer 210, a second via plug $VP_2$ disposed in the first dielectric layer 210 and adjacent to the first via plug $VP_1$, a first cylindrical memory stack $MS_1$ disposed on the first via plug $VP_1$, and a second cylindrical memory stack $MS_2$ disposed on the second via plug $VP_2$. The first cylindrical memory stack $MS_1$ comprises a first magnetic tunnel junction element $MTJ_1$, and a second cylindrical memory stack $MS_2$ comprises a second magnetic tunneling junction element MTJ2.

According to an embodiment of the present invention, the substrate 100 may comprise a semiconductor substrate, for example, a silicon substrate, but is not limited thereto. The substrate 100 has a memory area MA and a logic area LC. The first via plug $VP_1$, the second via plug $VP_2$, the first cylindrical memory stack $MS_1$, and the second cylindrical memory stack $MS_2$ are in the memory area MA. The first dielectric layer 210 covers the memory area MA and the logic area LC.

According to an embodiment of the invention, the magnetic memory device 1 further comprises an insulating cap layer 240 disposed conformally on the surface of the first dielectric layer 210 and sidewalls of the first cylindrical memory stack $MS_1$ and the second cylindrical memory stack $MS_2$. The insulating cap layer 240 is not disposed in a via forming region VR between the first cylindrical memory stack $MS_1$ and the second cylindrical memory stack MS2 in the memory area MA. According to an embodiment of the invention, the via forming region VR overlaps with the memory area MA.

According to an embodiment of the invention, the first dielectric layer 210 has a first minimum thickness $t_1$ in the memory area MA, a second minimum thickness $t_2$ in the via forming region VR between the first cylindrical memory stack $MS_1$ and the second cylindrical memory stack $MS_2$, and a third minimum thickness $t_3$ in the logic area LC. The second minimum thickness $t_2$ is approximately equal to the third minimum thickness $t_3$, and both the second minimum thickness $t_2$ and the third minimum thickness $t_3$ are smaller than the first minimum thickness $t_1$.

According to an embodiment of the invention, the magnetic memory device 1 further comprises a second dielectric layer 220 disposed on the substrate 100 and below the first dielectric layer 210. According to an embodiment of the invention, the magnetic memory device 1 further comprises an etch stop layer 250 disposed between the first dielectric layer 210 and the second dielectric layer 220.

According to an embodiment of the present invention, the magnetic memory device 1 further comprises a first spacer $SP_1$ disposed on the insulating cap layer 240 and located around the first cylindrical memory stack $MS_1$, but the first spacer $SP_1$ is not disposed within the via forming region VR. According to an embodiment of the invention, the magnetic memory device 1 further comprises a second spacer $SP_2$ disposed on the insulating cap layer 240 and located around the second cylindrical memory stack $MS_2$, but the second spacer $SP_2$ is not disposed within the via forming region VR.

According to an embodiment of the invention, the etch stop layer 250 is a nitrogen-doped silicon carbide (NDC) layer. According to an embodiment of the invention, the first dielectric layer 210 and the second dielectric layer 220 comprise an ultra-low k material, such as SiCOH or other insulating material having a dielectric constant of less than 2.5. According to an embodiment of the invention, the insulating cap layer 240 is a silicon nitride layer. According to an embodiment of the invention, the first spacer $SP_1$ and the second spacer $SP_2$ are silicon oxide spacers.

According to an embodiment of the invention, at least one dielectric layer, for example, an interlayer dielectric layer 110 and an interlayer dielectric layer 120, is further disposed between the substrate 100 and the second dielectric layer 220. According to an embodiment of the present invention, the interlayer dielectric layer 110 and the interlayer dielectric layer 120 may be ultra-low k materials such as SiCOH or other insulating materials having a dielectric constant of less than 2.5, but are not limited thereto.

According to an embodiment of the invention, the magnetic memory device 1 further comprises a third dielectric layer 230, which is filled in the via forming region VR between the first cylindrical memory stack $MS_1$ and the second cylindrical memory stack $MS_2$. According to an embodiment of the invention, the third dielectric layer 230 covers the logic area LC. The third dielectric layer 230 directly contacts the first dielectric layer 210 in the logic area LC, and the third dielectric layer 230 directly contacts the first dielectric layer 210 in the via forming region VR.

According to an embodiment of the present invention, the magnetic memory device 1 further comprises a lower metal interconnect layer 310 disposed in the second dielectric layer 220. The lower metal interconnect layer 310 comprises a first metal pad $MP_1$ directly contacting the first via plug $VP_1$, a second metal pad $MP_2$ directly contacting the second via plug $VP_2$, and a first metal line $MW_1$ between the first metal pad $MP_1$ and the second metal pad $MP_2$.

According to an embodiment of the invention, the magnetic memory device 1 further comprises a first conductive via $MV_1$ in the third dielectric layer 230, the first dielectric layer 210, and the etch stop layer 250 within the via forming region VR. The first conductive via $MV_1$ is in direct contact with the first metal line $MW_1$.

According to an embodiment of the invention, the magnetic memory device 1 further comprises a second metal line $MW_2$ disposed in the second dielectric layer 220 within the logic area LC. The second metal line $MW_2$ is part of the lower metal interconnect layer 310. According to an embodiment of the invention, the magnetic memory device 1 further comprises a second conductive via $MV_2$ disposed in the third dielectric layer 230, the first dielectric layer 210 and the etch stop layer 250. The second conductive via $MV_2$ is in direct contact with the second metal line $MW_2$. Those skilled in the art will appreciate that the first metal line $MW_1$ and the second metal line $MW_2$ may comprise metal traces and metal pads.

According to an embodiment of the present invention, a semiconductor element 101, such as a metal oxide semiconductor (MOS) transistor, may be disposed on the substrate 100 within the logic area LC. According to an embodiment of the present invention, the second metal line $MW_2$ in the logic area LC may be electrically connected to a terminal of the underlying semiconductor element 101 such as a drain 103 of the MOS transistor through the interconnect structures 410, 510, 512 formed in the interlayer dielectric layer 110 and the interlayer dielectric layer 120. According to an embodiment of the invention, the interconnect structure 410 may belong to the via layer $V_1$, and the interconnect structure 510 may belong to the metal layer $M_1$.

According to an embodiment of the invention, the first via plug $VP_1$ and the second via plug $VP_2$ are tungsten plugs, and the first conductive via $MV_1$ and the second conductive via $MV_2$ are copper vias. According to an embodiment of the invention, the first conductive via $MV_1$ and the second conductive via $MV_2$ may be a copper dual damascene via structure composed of a metal layer $M_3$ and a via layer $V_2$. Since the copper dual damascene interconnect is a well-known technique in semiconductor manufacturing, its detailed structure will not be described herein. Typically, the copper dual damascene interconnect comprises at least a barrier layer (e.g., tantalum and tantalum nitride) and a copper metal layer.

According to the embodiment of the present invention, the top surface $TS_1$ of the first conductive via $MV_1$, the top surface $TS_2$ of the second conductive via $MV_2$, the top surface 230a of the third dielectric layer 230, the top surface $TS_3$ of the first cylindrical memory stack $MS_1$, and the top surface $TS_4$ of the second cylindrical memory stack MS2 are coplanar.

Figure 2:
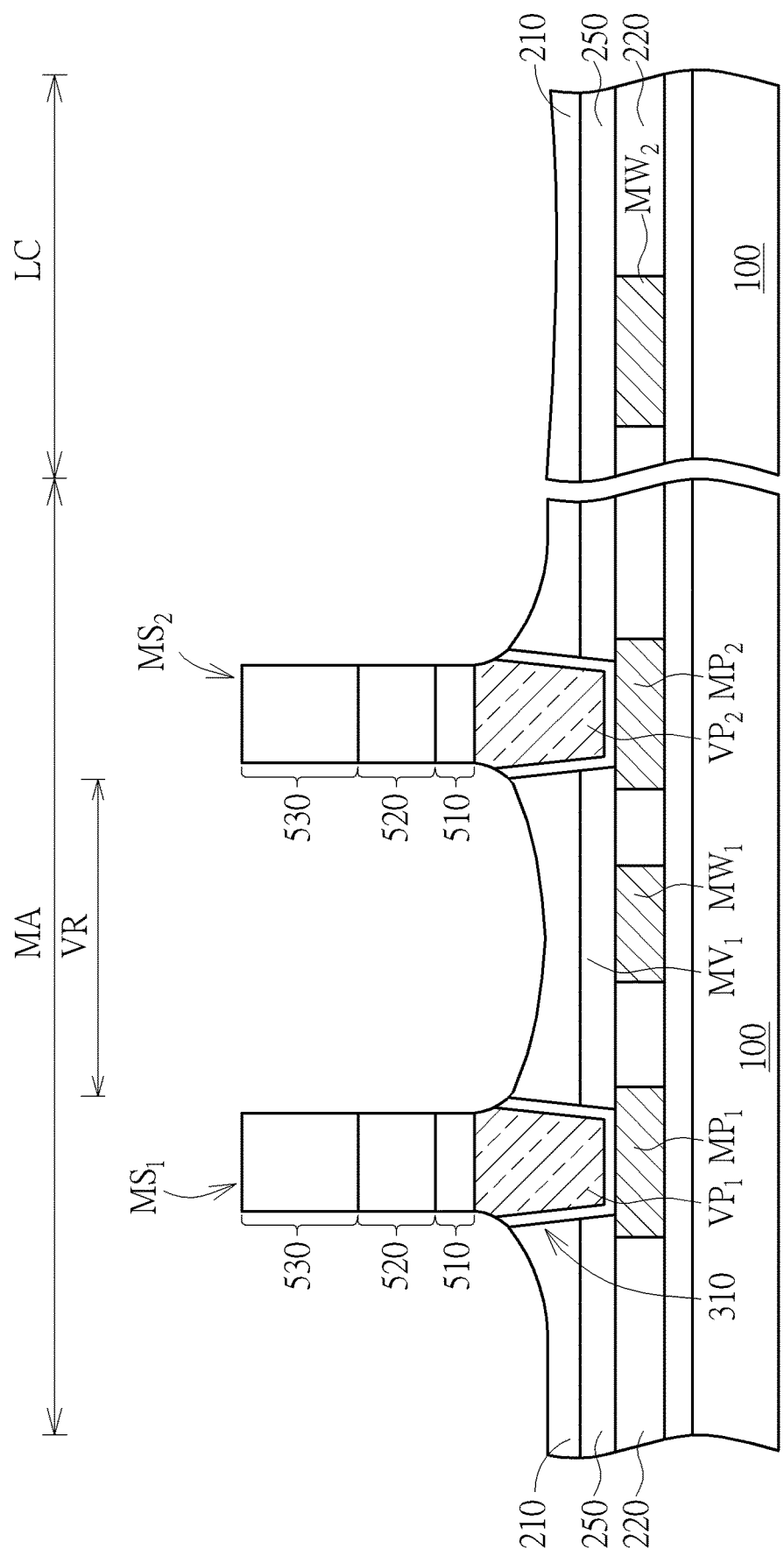
FIG. 2 to FIG. 7 illustrate a method of forming a magnetic memory device.

Referring to FIG. 2 to FIG. 7, another aspect of the present invention provides a method of forming a magnetic memory device. As shown in FIG. 2, a substrate 100 is first provided having a memory area MA and a logic area LC thereon. A first dielectric layer 210 is formed on the substrate 100. The first dielectric layer 210 covers the memory area MA and the logic area LC. A first via plug $VP_1$ and a second via plug $VP_2$ are formed in the first dielectric layer 210 in the memory area MA. A first cylindrical memory stack $MS_1$ and a second cylindrical memory stack $MS_2$ are formed on the first via plug $VP_1$ and the second via plug $VP_2$, respectively. The first cylindrical memory stack $MS_1$ and the second cylindrical memory stack $MS_2$ protrude from the top surface of the first dielectric layer 210.

According to an embodiment of the invention, the first cylindrical memory stack $MS_1$ and the second cylindrical memory stack $MS_2$ may include a bottom electrode 510, a magnetic tunneling junction (MTJ) layer 520 disposed on the bottom electrode, and a top electrode 530 disposed on the MTJ layer 520. The bottom electrode 510 may include, for example but not limited to, tantalum (Ta), platinum (Pt), copper (Cu), gold (Au), aluminum (Al), or the like. The multi-layer structure of the MTJ layer 520 is well known, and the details thereof will not be described herein. For example, the MTJ layer 520 may comprise a fixed layer, a free layer, and a capping layer, but is not limited thereto. The fixed layer may be composed of an antiferromagnetic (AFM) material, for example, iron manganese (FeMn), platinum manganese (PtMn), lanthanum manganese (IrMn), nickel oxide (NiO), etc., for fixing or limiting the direction of the magnetic moment of the adjacent layer. The free layer may be composed of a ferromagnetic material such as iron, cobalt, nickel or an alloy thereof such as cobalt-iron-boron (CoFeB), but is not limited thereto. According to an embodiment of the present invention, for example, the top electrode 530 may comprise a ruthenium (Ru) layer and a tantalum (Ta) layer, but is not limited thereto.

According to an embodiment of the invention, the method further comprises: forming a second dielectric layer 220 under the first dielectric layer 210 on the substrate 100 and forming an etch stop layer 250 between the first dielectric layer 210 and the second dielectric layer 220. According to an embodiment of the invention, the etch stop layer 250 is a nitrogen-doped silicon carbide (NDC) layer. The first dielectric layer 210 and the second dielectric layer 220 comprise an ultra-low k material, such as SiCOH or other insulating material having a dielectric constant of less than 2.5, but is not limited thereto.

According to an embodiment of the invention, the method further comprises: forming a lower metal interconnect layer 310 in the second dielectric layer 220. The lower metal interconnect layer 310 comprises a first metal pad $MP_1$ directly contacting the first via plug $VP_1$, a second metal pad $MP_2$ contacting the second via plug $VP_2$, and a first metal line $MW_1$ between the first metal pad $MP_1$ and the second metal pad $MP_2$. According to an embodiment of the invention, the method further comprises: forming a second metal line $MW_2$ in the second dielectric layer 220 in the logic area LC.

Figure 3:
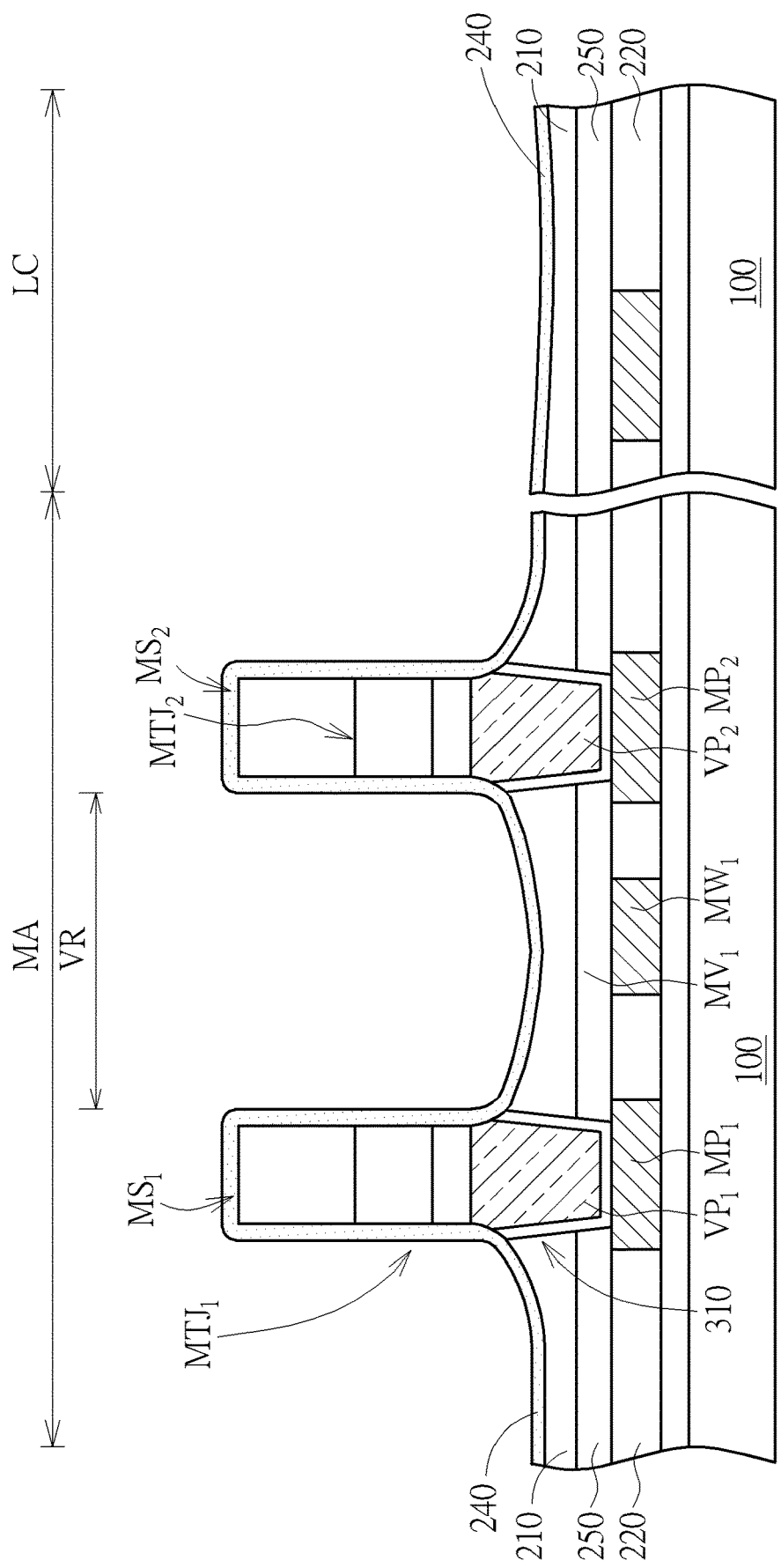

As shown in FIG. 3, an insulating cap layer 240 is deposited conformally on the first cylindrical memory stack $MS_1$, the second cylindrical memory stack $MS_2$, and the first dielectric layer 210. According to an embodiment of the invention, the insulating cap layer 240 may be a silicon nitride (SiN) layer. At this point, the insulating cap layer 240 covers the memory area MA and the logic area LC.

Figure 4:
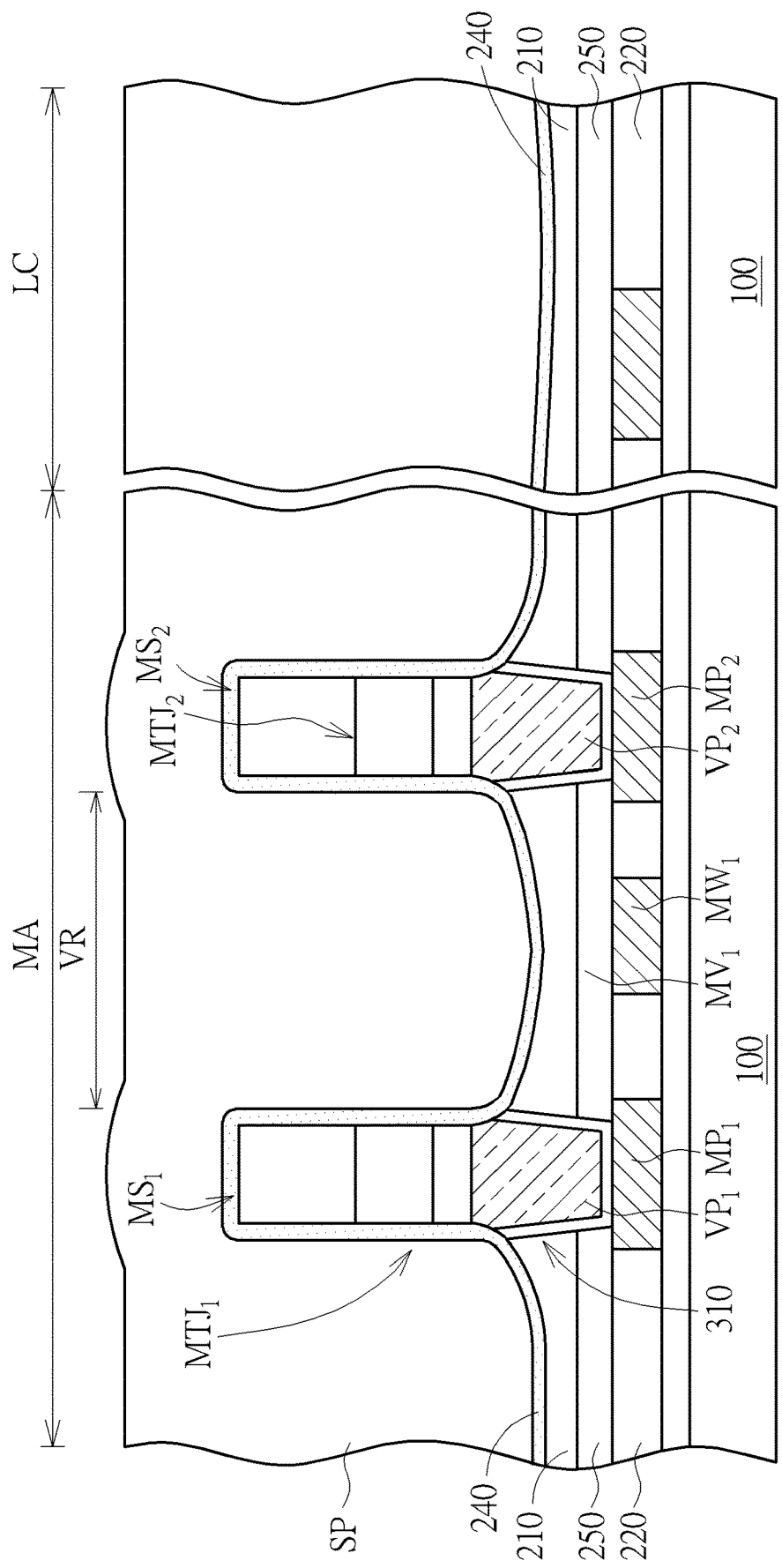

As shown in FIG. 4, a spacer layer SP is then deposited over the insulating cap layer 240. According to an embodiment of the invention, the spacer layer SP may be a silicon oxide layer. According to an embodiment of the present invention, the spacer layer SP may be formed by a chemical vapor deposition (CVD) process, for example, an atomic layer deposition (ALD) process, but is not limited thereto.

Figure 5:
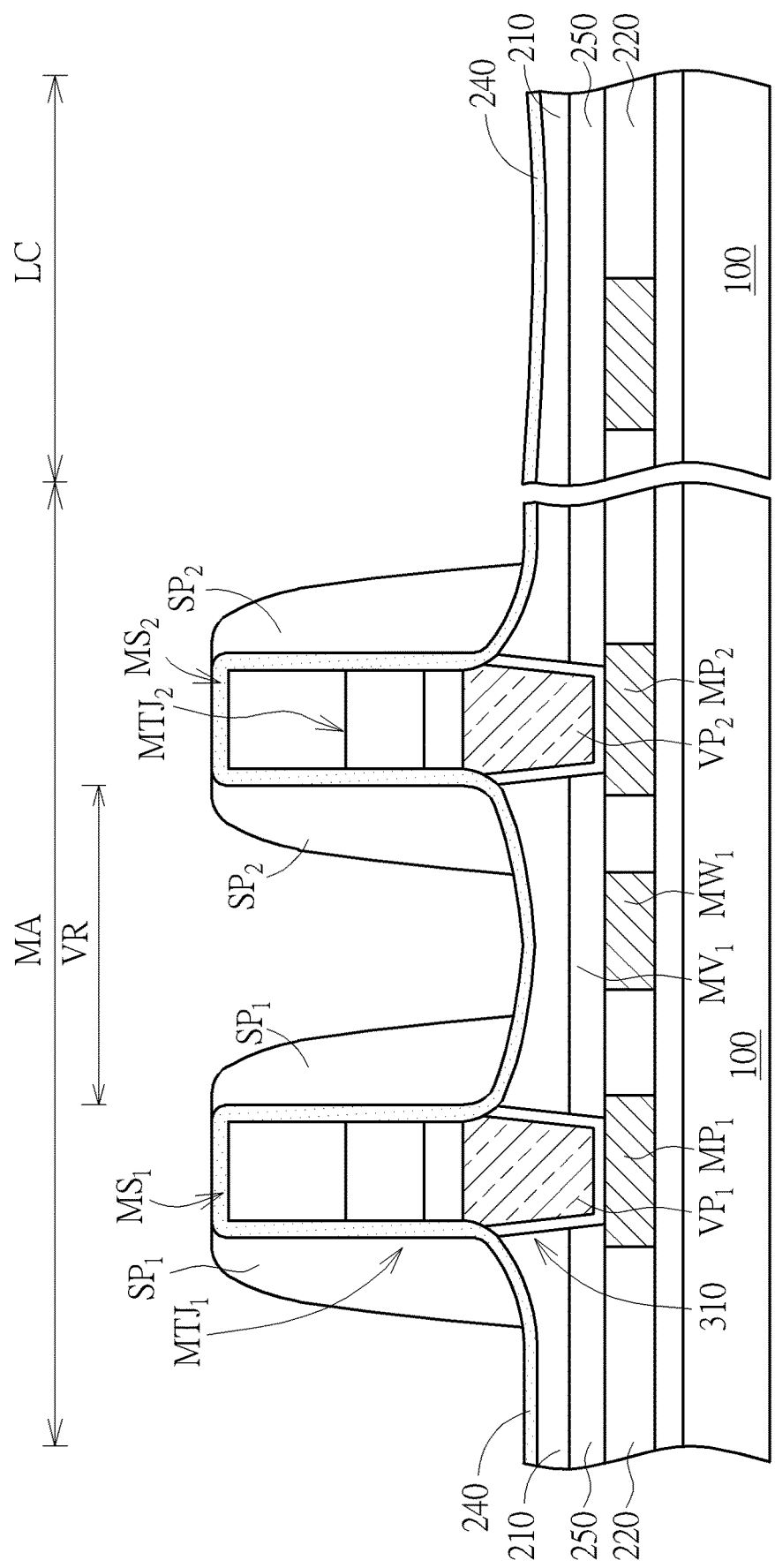

As shown in FIG. 5, the spacer layer SP is anisotropically dry etched, so that the first spacer $SP_1$ is formed on the insulating cap layer 240, surrounding the first cylindrical memory stack $MS_1$, and the second spacer $SP_2$ surrounding the second cylindrical memory stack $MS_2$.

Figure 6:
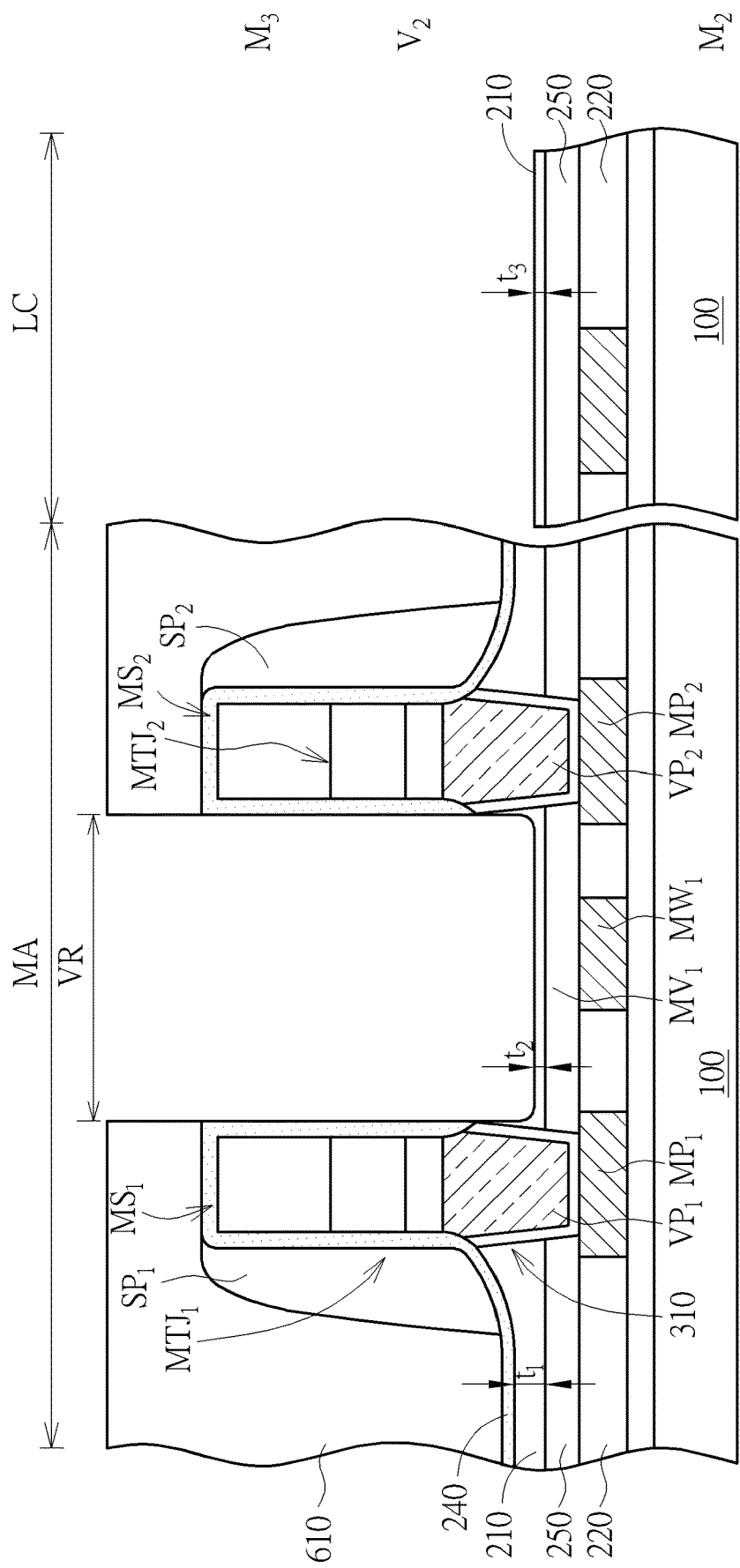

As shown in FIG. 6, an etch mask 610 is formed to cover the memory area MA, but the logic area LC is exposed. The etch mask 610 also exposes a via forming region VR between the first cylindrical memory stack $MS_1$ and the second cylindrical memory stack $MS_2$. According to an embodiment of the invention, the etch mask is a patterned photoresist layer. Then, an anisotropic dry etching process is performed to etch away the exposed insulating cap layer 240 and a portion of the first dielectric layer 210 from the via forming region VR, and etch away the exposed insulating cap layer 240 and a portion of first dielectric layer 210 from the logic area LC.

According to an embodiment of the present invention, as shown in FIG. 6, the method further comprises: etching away a portion of the first spacer $SP_1$ and a portion of the second spacer $SP_2$ from the via forming region VR. According to an embodiment of the invention, the method further comprises: removing the etch mask 610.

At this point, the first dielectric layer 210 has a first minimum thickness $t_1$ in the memory area MA, a second minimum thickness $t_2$ in the via forming region VR between the first cylindrical memory stack $MS_1$ and the second cylindrical memory stack $MS_2$, and a third minimum thickness $t_3$ in the logic area LC. The second minimum thickness $t_2$ is approximately equal to the third minimum thickness $t_3$. The second minimum thickness $t_2$ and the third minimum thickness $t_3$ are smaller than the first minimum thickness $t_1$.

Figure 7:
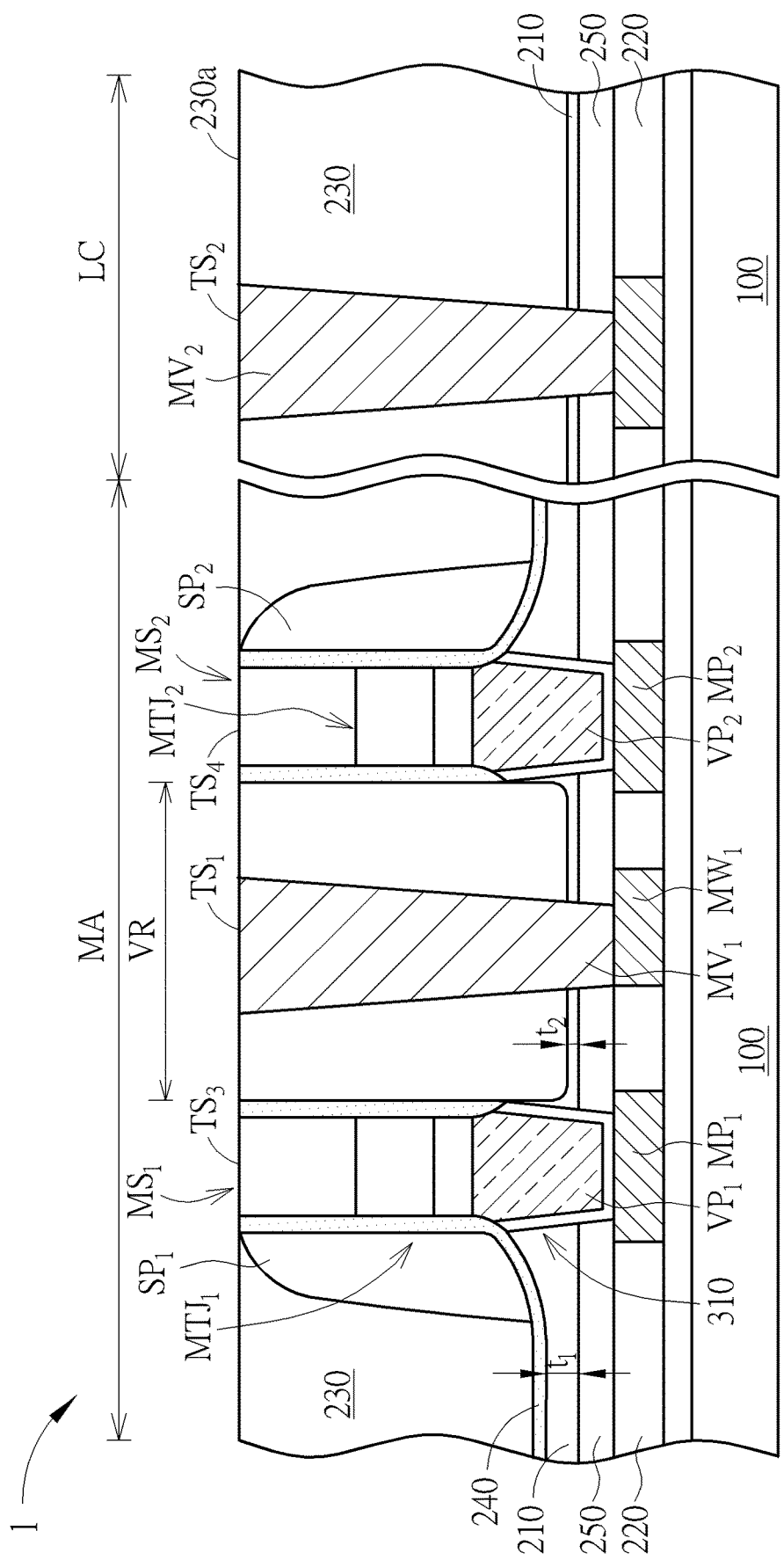

As shown in FIG. 7, a third dielectric layer 230, for example, an ultra-low k material, is deposited such that the third dielectric layer 230 covers the logic area and the memory area MA, and the third dielectric layer 230 is filled in the via forming region VR between the first cylindrical memory stack $MS_1$ and the second cylindrical memory stack $MS_2$. Since the insulating cap layer 240 has been removed from the logic area LC and the via forming region VR in the previous step, the third dielectric layer 230 is in direct contact with the first dielectric layer 210 in the logic area LC and in the via forming region VR. Next, a chemical mechanical polishing (CMP) process may be performed to polish away a portion of the third dielectric layer 230 until the top surfaces $TS_3$ and $TS_4$ of the first cylindrical memory stack $MS_1$ and the second cylindrical memory stack $MS_2$ are exposed.

Subsequently, a lithography and etching process is performed to form a first conductive via $MV_1$ in the third dielectric layer 230, the first dielectric layer 210, and the etch stop layer 250 in the via forming region VR. The first conductive via $MV_1$ is in direct contact with the first metal line $MW_1$. A second conductive via $MV_2$ is formed in the third dielectric layer 230, the first dielectric layer 210 and the etch stop layer 250 in the logic area LC. The second conductive via $MV_2$ is in direct contact with the second metal line $MW_2$.

According to the embodiment of the present invention, the CMP process may be performed such that the top surface of the first conductive via MV1 and the second conductive via MV2, the top surface 230a of the third dielectric layer 230, and the top surfaces $TS_3$ and $TS_4$ of the first cylindrical memory $MS_1$ and the second cylindrical memory stack $MS_2$ are coplanar.

One technical feature of the present invention is that when the metal layer $M_3$ and the via layer $V_2$ are etched, the formation of the first conductive via $MV_1$ formed in the via forming region VR in the memory area MA is compatible with the formation of the second conductive via MV2 in the logic area LC, such that the insulating cap layer 240 does not affect the formation of the first conductive via $MV_1$ in the via forming region VR. In addition, the present invention can avoid voids in the via forming region VR between the first cylindrical memory stack $MS_1$ and the second cylindrical memory stack $MS_2$. The void may result in shorting between the first conductive via $MV_1$ and the cylindrical memory stack in the memory area MA.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetic memory device, comprising:
    a substrate having a memory area and a logic area thereon;
    a first dielectric layer disposed on the substrate, wherein the first dielectric layer covers the memory area and the logic area;
    a first via plug disposed in the first dielectric layer;
    a first cylindrical memory stack disposed on the first via plug, wherein the first cylindrical memory stack comprises a first magnetic tunnel junction (MTJ) element;
    a second via plug disposed in the first dielectric layer and in proximity to the first via plug;
    a second cylindrical memory stack disposed on the second via plug, wherein the second cylindrical memory stack comprises a second magnetic tunnel junction (MTJ) element;
    an insulating cap layer conformally disposed on the first dielectric layer and on sidewalls of the first cylindrical memory stack and the second cylindrical memory stack, wherein the insulating cap layer is not disposed in the logic area and a via forming region between the first cylindrical memory stack and the second cylindrical memory stack, wherein the first dielectric layer has a first minimum thickness in the memory area, a second minimum thickness in the via forming region between the first cylindrical memory stack and the second cylindrical memory stack, wherein the second minimum thickness is smaller than the first minimum thickness.

2. The magnetic memory device according to claim 1, wherein the first dielectric layer has a third minimum thickness in the logic area, wherein the second minimum thickness is approximately equal to the third minimum thickness, and wherein the second minimum thickness and the third minimum thickness are smaller than the first minimum thickness.

3. The magnetic memory device according to claim 1 further comprising:
    a second dielectric layer disposed on the substrate and under the first dielectric layer; and
    an etch stop layer between the first dielectric layer and the second dielectric layer.

4. The magnetic memory device according to claim 1 further comprising:
    a first spacer disposed on the insulating cap layer and disposed around the first cylindrical memory stack except for the via forming region; and
    a second spacer disposed on the insulating cap layer and disposed around the second cylindrical memory stack except for the via forming region.

5. The magnetic memory device according to claim 4, wherein the etch stop layer is a nitrogen-doped silicon carbide layer, the first dielectric layer and the second dielectric layer comprise an ultra-low k material, the insulating cap layer is a silicon nitride layer, and the first spacer and the second spacer are silicon oxide spacers.

6. The magnetic memory device according to claim 5 further comprising a third dielectric layer filled into the via forming region between the first cylindrical memory stack and the second cylindrical memory stack, and wherein the third dielectric layer also covers the logic area, and wherein the third dielectric layer is in direct contact with the first dielectric layer in the logic area and the first dielectric layer in the via forming region.

7. The magnetic memory device according to claim 6 further comprising a lower metal interconnect layer disposed in the second dielectric layer, wherein the lower metal interconnect layer comprises a first metal pad in direct contact with the first via plug, a second metal pad in direct contact with the second via plug, and a first metal line disposed between the first metal pad and the second metal pad.

8. The magnetic memory device according to claim 7 further comprising a first conductive via disposed in the third dielectric layer, the first dielectric layer and the etch stop layer, wherein the first conductive via is in direct contact with the first metal line.

9. The magnetic memory device according to claim 8 further comprising a second metal line disposed in the second dielectric layer within the logic area, and a second conductive via disposed in the third dielectric layer, the first dielectric layer and the etch stop layer, wherein the second conductive via is in direct contact with the second metal line.

10. The magnetic memory device according to claim 9, wherein the first via plug and the second via plug are tungsten plugs, and wherein the first conductive via and the second conductive via are copper vias.

11. The magnetic memory device according to claim 10, wherein the first conductive via and the second conductive via have a top surface that is coplanar with a top surface of the third dielectric layer and a top surface of the first cylindrical memory stack and the second cylindrical memory stack.

12. A method for forming a memory device, comprising:
    providing a substrate having a memory area and a logic area thereon;
    forming a first dielectric layer on the substrate, wherein the first dielectric layer covers the memory area and the logic area;
    forming a first via plug and a second via plug in the first dielectric layer in the memory area;
    forming a first cylindrical memory stack and a second cylindrical memory stack on the first via plug and the second via plug, respectively;
    conformally depositing an insulating cap layer on the first cylindrical memory stack, the second cylindrical memory stack, and the first dielectric layer;
    forming an etch mask covering the memory area but exposing the logic area, wherein the etch mask also exposes a via forming region between the first cylindrical memory stack and the second cylindrical memory stack; and
    etching away the insulating cap layer, and a portion of the first dielectric layer from the via forming region, and the insulating cap layer and a portion of the first dielectric layer from the logic area.

13. The method according to claim 12 further comprising:
depositing a spacer layer on the insulating cap layer; and
anisotropically etching the spacer layer, thereby forming a first spacer on the insulating cap layer and around the first cylindrical memory stack and a second spacer on the insulating cap layer and around the second cylindrical memory stack.

14. The method according to claim 13 further comprising:
etching away a portion of the first spacer and a portion of the second spacer from the via forming region.

15. The method according to claim 12, wherein the etch mask is a patterned photoresist layer.

16. The method according to claim 12 further comprising:
removing the etch mask.

17. The method according to claim 16 further comprising:
forming a second dielectric disposed on the substrate and under the first dielectric layer; and
forming an etch stop layer between the first dielectric layer and the second dielectric layer.

18. The method according to claim 17, wherein the etch stop layer is a nitrogen-doped silicon carbide layer, the first dielectric layer and the second dielectric layer comprise an ultra-low k material, the insulating cap layer is a silicon nitride layer, and the spacer layer is a silicon oxide layer.

19. The method according to claim 17 further comprising:
forming a third dielectric layer into the via forming region between the first cylindrical memory stack and the second cylindrical memory stack, wherein the third dielectric layer also covers the logic area, and wherein the third dielectric layer is in direct contact with the first dielectric layer in the logic area and is in direct contact with the first dielectric layer in via forming region.

20. The method according to claim 19 further comprising:
forming a lower metal interconnect layer in the second dielectric layer, wherein the lower metal interconnect layer comprises a first metal pad in direct contact with the first via plug, a second metal pad in direct contact with the second via plug, and a first metal line disposed between the first metal pad and the second metal pad.

\* \* \* \* \*